(12) United States Patent
Bae

(10) Patent No.: US 10,389,296 B1
(45) Date of Patent: *Aug. 20, 2019

(54) METHOD FOR CONTROLLING INVERTER IN SOLAR PUMP SYSTEM

(71) Applicant: LSIS CO., LTD., Anyang-si, Gyeonggi-do (KR)

(72) Inventor: Chae-Bong Bae, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/283,071

(22) Filed: Feb. 22, 2019

(30) Foreign Application Priority Data

May 10, 2018 (KR) .................. 10-2018-0053452

(51) Int. Cl.
  *H02S 40/32* (2014.01)
  *H02M 7/5387* (2007.01)
  *G01R 19/165* (2006.01)
  *G05F 1/67* (2006.01)
  *F04D 13/06* (2006.01)
  *H02M 1/00* (2006.01)
  *H02M 1/42* (2007.01)

(52) U.S. Cl.
  CPC .............. *H02S 40/32* (2014.12); *F04D 13/06* (2013.01); *G01R 19/16528* (2013.01); *G05F 1/67* (2013.01); *H02M 7/53871* (2013.01); *H02M 1/425* (2013.01); *H02M 7/53875* (2013.01); *H02M 2001/0003* (2013.01)

(58) Field of Classification Search
  CPC ......................... H02M 1/425; H02M 7/4826
  USPC ................ 323/906; 363/35, 97, 98, 137
  See application file for complete search history.

(56) References Cited

U.S. PATENT DOCUMENTS

| | | | |
|---|---|---|---|
| 6,229,278 B1* | 5/2001 | Garces | H02M 7/53875 318/801 |
| 2014/0218985 A1* | 8/2014 | Yu | H02M 7/537 363/97 |
| 2015/0078049 A1* | 3/2015 | Yoo | H02M 7/53871 363/123 |
| 2016/0308465 A1* | 10/2016 | Yoo | H02M 1/12 |

* cited by examiner

*Primary Examiner* — Gary A Nash
(74) *Attorney, Agent, or Firm* — K&L Gates LLP

(57) ABSTRACT

There is disclosed a method for controlling an inverter in a solar pump system. The method includes; when a current DC link voltage is above or equal to a reference level, and when a previous output frequency of an alternating-current voltage applied to a load increased in a previous period, increasing an current output frequency of an AC voltage to be applied to the load at a first slope; and when the current DC link voltage is above or equal to the reference level, and when the previous output frequency of the AC voltage applied to the load decreased in the previous period, increasing the current output frequency of the AC voltage to be applied to the load at a second slope smaller than the first slope.

6 Claims, 3 Drawing Sheets

METHOD FOR CONTROLLING INVERTER IN SOLAR PUMP SYSTEM

CROSS-REFERENCE TO RELATED APPLICATION

Pursuant to 35 U.S.C. § 119(a), this application claims the benefit of earlier filing date and right of priority to Korean Application No. 10-2018-0053452, filed on May 10, 2018, which is herein expressly incorporated by reference in its entirety.

TECHNICAL FIELD

The present disclosure relates to a method for controlling an inverter.

BACKGROUND

A solar pump system produces and supplies fresh water by driving a pump through an inverter using energy generated from a photovoltaic module. This solar pump system can supply water and electricity most effectively. The solar pump system may be used in a variety of applications such as supply of drinking water, agricultural water and seawater desalination in areas where a fresh water network infrastructure is insufficient.

In particular, the solar pump system is regarded as an optimal system that can solve power and water shortage in a remote area by supplying groundwater without receiving additional energy, in the remote area where the power supply is difficult. The Government of India has authorized installations of 50,000 solar pumps in 2014 for irrigation and drinking water supply and is expanding installations of the solar pumps up to now.

FIG. 1 shows a configuration of a conventional solar pump system.

The conventional solar pump system shown in FIG. 1 is configured to have a solar module 100, an inverter 200, and a controller 300.

One of important control methods of the solar pump system that generates power using solar light is a maximum power point tracking (MPPT)-based control method. A solar inverter may generate a maximum power via the MPPT-based control method which always tracks a maximum power generation point from a solar cell.

Among the conventional MPPT-based control methods, a hill climbing method is the most basic MPPT-based control method. The hill climbing method finds the maximum power point by changing a duty by a certain amount of a displacement. Although a controller based on the hill climbing method has a simple configuration, there is a problem that the maximum power point estimation is slow in a sudden change of a solar irradiation quantity.

Among the conventional MPPT-based control methods, a disturbance and observation method is the most common MPPT-based control method. This method operates at the maximum power point by measuring a change of the power according to an increase or decrease of a voltage. This disturbance and observation method has a problem that a control performance is deteriorated when a light amount is low.

Among the conventional MPPT-based control methods, an impedance matching method uses a fact that an output of an solar cell becomes maximum at a point where an impedance of a load becomes equal to an impedance of the solar cell. The impedance matching method is excellent in tracking performance, but is somewhat complicated and requires a large number of operations.

Thus, in a solar pump system such as FIG. 1 using the MPPT-based control method for various conventional solar pump systems, in order that a controller 300 controls a voltage applied to a water pump 400, the controller utilizes a DC link voltage and an output current of an inverting module 52 as information for generating a PWM output waveform of an inverter 200 and for detecting a low voltage/over-voltage. That is, a voltage sensor 210 provides the DC link voltage of the inverter 200 to the controller 300. A current sensor 220 provides the output current of the inverter 200 to the controller 300. Thus, the controller generate the PWM output waveform therefrom.

However, a sudden increase in the DC link voltage causes an over voltage problem. A sudden drop in the DC link voltage causes a low voltage problem. The water pump 400 cannot operate under the low voltage and over-voltage conditions. Thus, frequent stoppages or changes of the operation state of the water pump 400 may cause a failure of the water pump 400 as in case of frequent frequency changes, and, thus, a lot of energy loss may occur.

Further, since a PWM-based variable frequency output from the inverter 200 is detected instead of an input power to the inverter 200 in a conventional approach, an accuracy of calculation of the output power is lowered. Thus, there is a problem that a stress of the water pump 400 is increased due to pulsation of the output frequency.

Since the controller 300 detects the voltage and output current of each node of the inverter 200 and performs the MPPT-based control based on the detected voltage and current, the controller 300 must accurately detect the voltage and the current. Thus, the higher the required accuracy, the higher a price of the sensor placed in the system.

SUMMARY

In order to solve the problem, a purpose of the present disclosure is to provide an inverter-controlling method that prevents an increase of a stress due to a pulsation of an output frequency by tracking a maximum power point using a DC link voltage of an inverter.

In one aspect of the present disclosure, there is provided a method for controlling an inverter, wherein the invertor converts power received from a solar module and supplies the converted power to a load, the method comprising: receiving a current direct-current (DC) link voltage of the inverter; when the current DC link voltage is above or equal to a reference level, and when a previous output frequency of an alternating-current (AC) voltage applied to the load increased in a previous period, increasing an current output frequency of an AC voltage to be applied to the load at a first slope; and when the current DC link voltage is above or equal to the reference level, and when the previous output frequency of the AC voltage applied to the load decreased in the previous period, increasing the current output frequency of the AC voltage to be applied to the load at a second slope smaller than the first slope.

In one implementation, the method further comprises: when the current DC link voltage is below the reference level, and when a previous DC link voltage in the previous period is below the reference level, decreasing the current output frequency of the AC voltage to be applied to the load.

In one implementation, the method further comprises: when the current DC link voltage is below the reference level, and when a previous DC link voltage in the previous period is above or equal to the reference level, storing the current output frequency in a current period as a first output frequency, and decreasing the current output frequency of the AC voltage to be applied to the load.

In one implementation, the method further comprises: when a further output frequency increased at the second slope is greater than or equal to the first output frequency, fixing the further output frequency.

In one implementation, the method further comprises: when the current DC link voltage is stable for a predetermined time after fixing the further output frequency, clearing the current decreased output frequency state and clearing the first output frequency.

In one implementation, whether the current DC link voltage is stable is based on whether the current DC link voltage varies in a threshold range.

According to the present disclosure, energy generated from a photovoltaic module may be utilized to a maximum level via detecting the change of the DC link voltage without an additional sensor.

Further specific effects of the present disclosure as well as the effects as described above will be described in conduction with illustrations of specific details for carrying out the invention.

DETAILED DESCRIPTION

Figure 1:
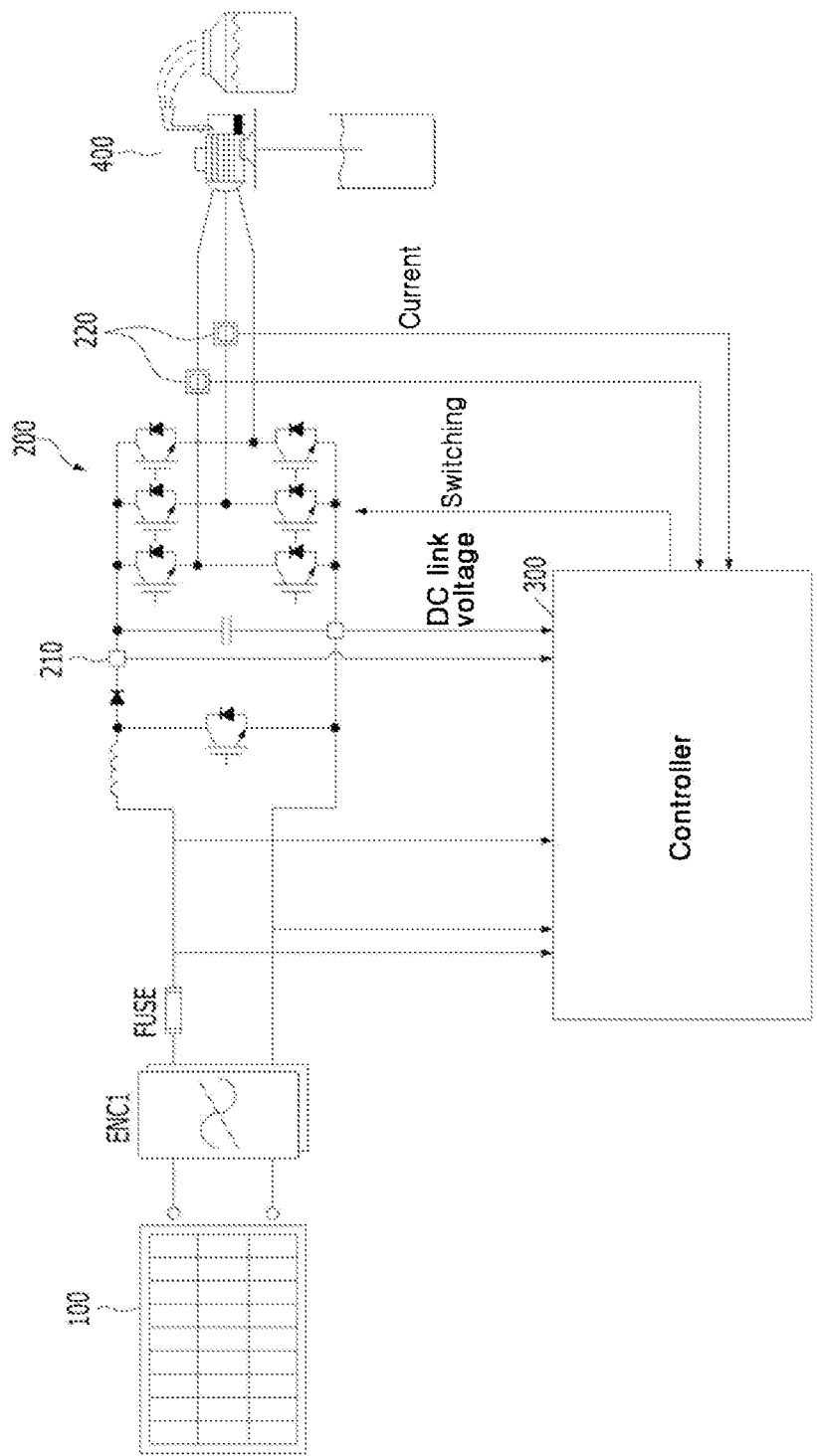
FIG. 1 shows a configuration of a conventional solar pump system.

Hereinafter, a inverter-controlling method in accordance with the present disclosure will be described with reference to the accompanying drawings.

For simplicity and clarity of illustration, elements in the figures. are not necessarily drawn to scale. The same reference numbers in different figures. denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Unless defined otherwise, all terms used herein have the same meaning as commonly understood by one of ordinary skill in the art. When the terms used herein are in conflict with a general meaning of the term, the meaning of the term is in accordance with a definition used herein.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Hereinafter, an inverter-controlling method according to one embodiment of the present disclosure will be described with reference to FIG. 2 and FIG. 3.

Figure 2:
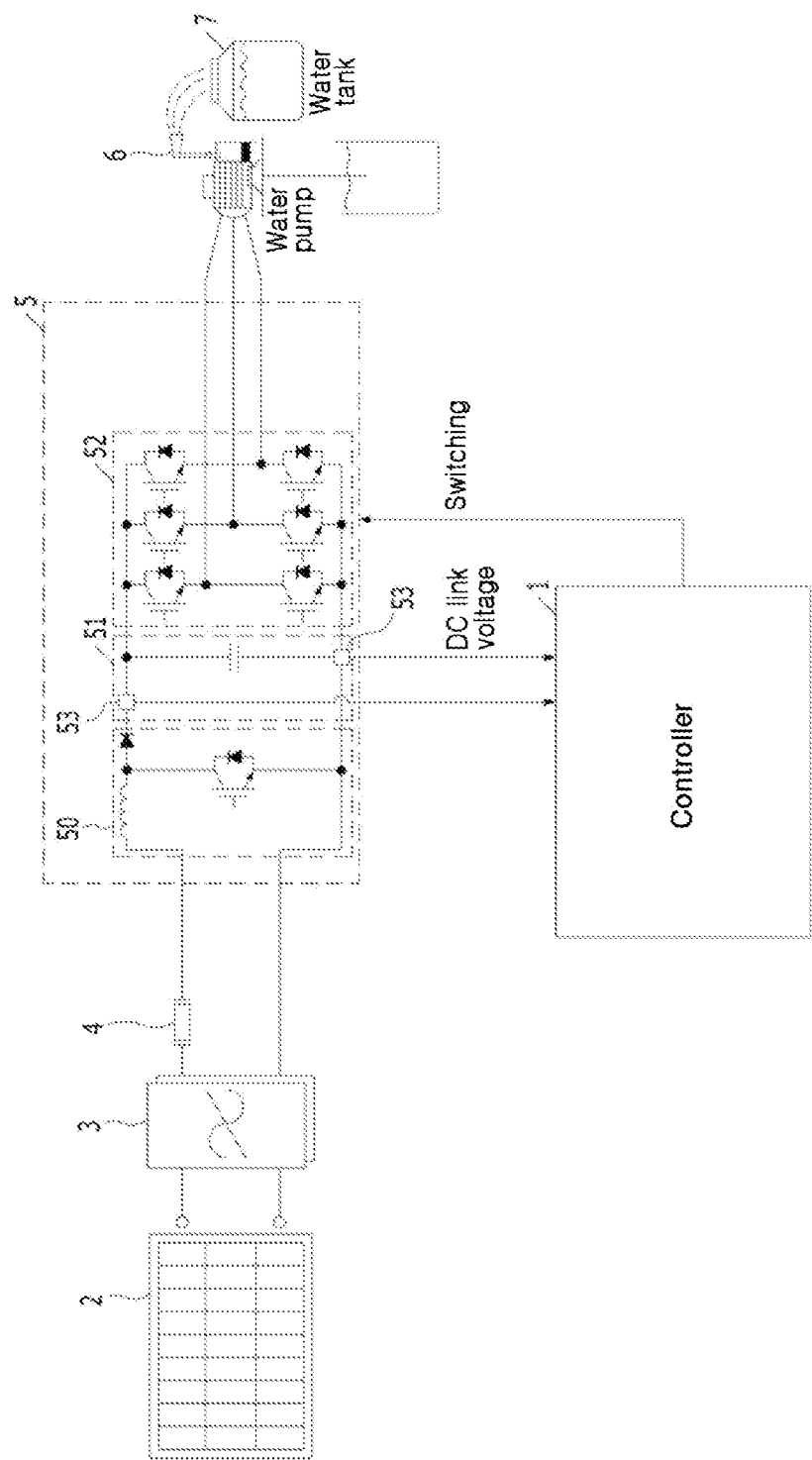
FIG. 2 is a schematic representation of a solar pump system to which one embodiment of the present disclosure is applied.

FIG. 2 is a schematic representation of a solar pump system to which one embodiment of the present disclosure is applied.

As shown in FIG. 2, the solar pump system to which one embodiment of the present disclosure is applied may include a solar module 2, an electromagnetic compatibility (EMC) filter 3, a fuse 4, an inverter 5, a controller 1, a water pump 6, and a water tank 7. However, in one embodiment of the present disclosure, an example of using the water pump 6 as a load for the inverter 5 is illustrated, but the present disclosure is not limited thereto. Various examples in which the energy generated by the solar module 2 is transferred to various loads via the inverter 5 may be implemented.

Further, the inverter 5 may include a boost converter 50, a DC link capacitor 51, an inverting module 52, and a voltage sensor 53.

The solar module 2 may be an array of solar cells vertically and horizontally. In the solar module, electricity generated by individual solar cells may be simultaneously collected in the solar module to produce electric power.

The EMC filter 3 minimizes an electromagnetic interference generated by the power applied from the solar module 2. This may prevent damage due to such electromagnetic interference. The EMC filter 3 may block a excessive current flow to the fuse 40 or inverter 5. However, the EMC filter 3 and the fuse 4 may be illustrative and may be merely examples. Various elements for eliminating the noise generated by the power input from the solar module 2 may be used in an exemplary embodiment of the solar pump system of the present disclosure.

The DC voltage from which the noise is removed by the EMC filter 3 and the fuse 4 may be applied to the inverter 5. The DC voltage applied to the inverter 5 may be boosted by the boost converter 50. The boosted DC voltage may be stored in the DC link capacitor 51.

The controller 1 according to one embodiment of the present disclosure generates a switching signal for controlling switching of a plurality of switching elements of the inverting module 52 of the inverter 5 based on the DC link voltage detected by a voltage sensor 53. The controller may then provide the switching signal to the inverting module 52. That is, under the control of the controller 1, an output frequency of the inverting module 52 of the inverter 5 may be determined. This will be described in detail later.

A change in the DC link voltage of the inverter 5 varies with a quantity of the solar irradiation. When the DC link voltage is sufficient, the voltage variation is small. When the DC link voltage is insufficient, the voltage variation may become large.

The water pump 6 may be driven by a AC voltage output from the inverting module 52 of the inverter 5. Thus, water drawn up by the water pump 6 may be stored in the water tank 7. The water transferred to the water tank 7 may be used as drinking water, industrial water, agricultural water, livestock water, and the like.

In the conventional case, tracking the maximum power point by using the inverter output current may cause the system stress to be increased by the sudden output frequency pulsation. In one embodiment of the present disclosure, the maximum power may be tracked using only the DC link voltage of the inverter without requiring additional sensors. This may prevent an increase in the system stress due to the pulsation of the output frequency.

That is, the controller 1 in accordance with one embodiment of the present disclosure increases the output frequency of the inverter 2 when the DC link voltage is above or equal to a predetermined reference level. Further, when the output frequency is higher compared to the energy generated from the solar module 1 and thus the DC link voltage becomes smaller than the reference level, the controller 1 may back reduce the output frequency to prevent the DC link voltage from decreasing.

Further, the controller does not increase the output frequency immediately after the DC link voltage has been again sufficient when the controller 1 had decreased the output frequency. Rather, the controller stably raises the output frequency to an output frequency level at a time when the DC link voltage has been insufficient, and then determines a stability of the DC link voltage. When the controller 1 determines that the DC link voltage is stable, the controller performs a normal acceleration operation. The detailed operation of the controller 1 will be described with reference to the drawings.

Figure 3:
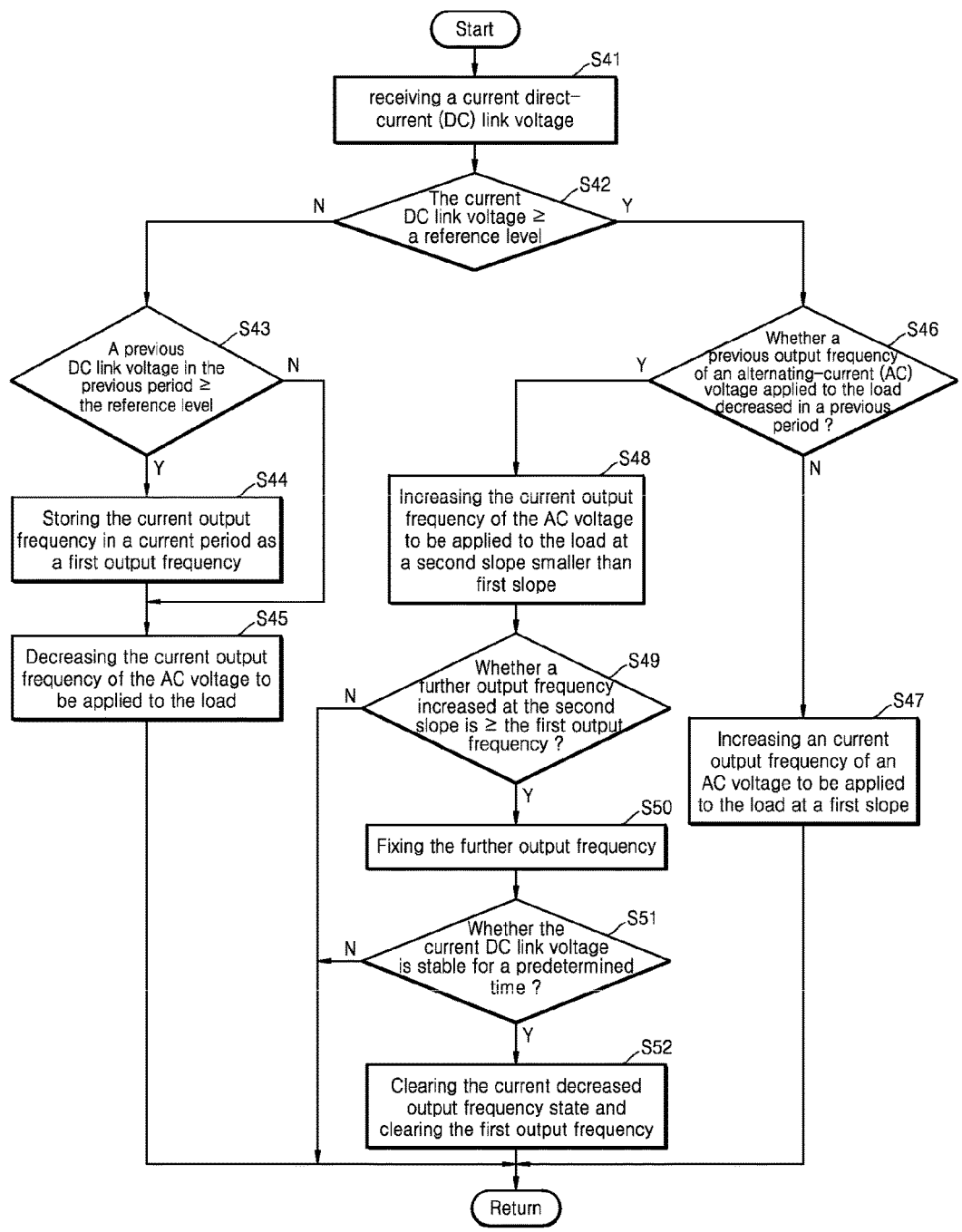
FIG. 3 is a flow chart describing an inverter-controlling method in accordance with one embodiment of the present disclosure.

FIG. 3 is a flow chart describing an inverter-controlling method in accordance with one embodiment of the present disclosure.

In the system according to one embodiment of the present disclosure, as shown in FIG. 2, the controller 1 may periodically receive the DC link voltage from the voltage sensor 53 S41. The controller may determine whether the received DC link voltage is greater than or equal to the reference level or smaller than the reference level S42.

Upon determination S42 that the DC link voltage in a current period is smaller than the reference level, the controller 1 may again determine whether the DC link voltage in a previous period is greater than or equal to or smaller than the reference level S43.

Upon determination S43 that the DC link voltage in the previous period is greater than or equal to the reference level, the controller 1 may store an output frequency in the current period as a first output frequency S44, and decrease the output frequency S45. Then, the method may return. That is, when the DC link voltage decreases for the first time in the current period and becomes smaller than the reference level, the controller 1 stores the output frequency in the current period as the first output frequency S44, and then decreases the output frequency S45. Then, the method returns.

Decreasing the output frequency means decreasing the output frequency by an amount corresponding to a decreasing slope in a discrete manner, or continuously. That is, the controller 1 may continuously decrease the output frequency according to the decreasing slope over a predetermined time based on a setting. Alternatively, the controller 1 may decrease the output frequency by subtracting discrete values corresponding to the decreasing slope from a previous output frequency in the previous period.

However, when it is determined in S43 that the DC link voltage in the previous period is smaller than the reference level, the method may proceed to S45 which the controller reduces the output frequency.

In other words, when the DC link voltage becomes smaller than the reference level for the first time in the current period, the method may proceed to S45 which the controller reduces the output frequency.

The controller 1 transmits a PWM signal to gates of the plurality of the switching elements of the inverting module 52 of the inverter 5 to control on/off of the switching elements, such that the inverting module 52 outputs AC power. That is, when the controller 1 decreases the output frequency, the output frequency of the AC power synthesized by the inverting module 52 is decreased, and, thus, the output frequency of the AC power output from the inverting module 52 is decreased, so that the driving speed of the water pump 6 is slowed down.

Conversely, when, from a result of the determination in S42, the DC link voltage in the current period is greater than or equal to the reference level, the controller 1 may check whether the output frequency has decreased in the previous period.

When it is determined in S46 that the output frequency has not decreased in the previous period, the controller 1 may increment the output frequency by a frequency corresponding to a first slope S47. The method may return. That is, when the DC link voltage was greater than the reference level in the previous period, the controller 1 may increase the output frequency by the frequency corresponding to the first slope S47. Then, the method may return.

Increasing the output frequency means that the output frequency of the AC power synthesized by the switching elements of the inverting module 52 is increased and thus the driving speed of the water pump 6 is increased.

Further, increasing the output frequency at the first slope may mean increasing the output frequency by an amount corresponding to the first slope continuously or discretely. That is, the output frequency may be increased according to the first slope continuously for a predetermined time based on a setting. Alternatively, the output frequency may increase by adding discrete values corresponding to the first slope to a previous output frequency in the previous period.

However, when it is determined in S46 that the output frequency has decreased in the previous period, that is, when the DC link voltage had been insufficient and then again has been sufficient, the output frequency may be increased at a second slope smaller than the first slope at S47.

Then, controller 1 may check whether the output frequency increased at the second slope is greater than or equal to the first output frequency stored in S44. When the output frequency is greater than or equal to the first output frequency, the output frequency is fixed. When the output frequency is smaller than the first output frequency, the method returns.

After fixing the output frequency, the controller 1 may determine whether the DC link voltage is stable for a predetermined time S51.

The determination of whether or not the DC link voltage is stable may include determining a threshold range of a magnitude of the DC link voltage change, and determining that the DC link voltage is not stable when the change of the DC link voltage for a predetermined time is equal to or above the threshold range.

To the contrary, when the change of the DC link voltage for the predetermined time is smaller than the threshold range, it may be determined that the DC link voltage is stable. The threshold range of the DC link voltage change may be pre-stored by the controller 1 according to a setting. For the storage of the first output frequency and the storage of the threshold range, the controller 1 may further include a memory.

Thereafter, when it is determined in step S51 that the DC link voltage is stable for the predetermined time, the controller 1 may clear a current state. That is, the output frequency decreased state may be cleared, and the stored first output frequency may be cleared.

Thus, in the inverter-controlling method according to one embodiment of the present disclosure, the controller does not increase the output frequency immediately after the DC link voltage has been sufficient when the controller 1 had decreased the output frequency due to the insufficiency in the DC link voltage; rather, the controller 1 stably raises (at a smaller slope) the output frequency to an output frequency level (first output frequency) at a time when the DC link voltage had been insufficient, and then determines a stability of the DC link voltage for the predetermined time; then, when the controller 1 determines that the DC link voltage is stable for the predetermined time, the controller performs a normal acceleration operation (with a higher slope).

In one embodiment of the present disclosure, the frequency changes of the water pump 6 are frequent, resulting in the failure. Thus, when the DC link voltage is sufficient or equal to or above the reference level, the controller may increase the output frequency. To the contrary, when the DC link voltage is insufficient or smaller than the reference level, the output frequency may be decreased by the controller to prevent the DC link voltage from further decreasing. This may allow the energy generated by the solar module 2 to be used at the maximum degree while the low voltage problem does not occur.

In this connection, to prevent fluctuations in the output frequency that may occur due to the DC link voltage fluctuating depending on weather conditions or illumination level, when the DC link voltage transitions from an insufficient state to a sufficient state, the output frequency may be increased by the controller at a smaller slope that a slope at the sufficient state.

Further, when the DC link voltage transitions from the sufficient state to the insufficient state, a corresponding output frequency is stored. Then, when the output frequency increased by the controller at the smaller slope is greater than the stored output frequency, the output frequency is fixed. Then, the stability of the DC link voltage is determined. When it is determined that the DC link voltage is stable, the output frequency may be increased again.

The sudden increase in the DC link voltage causes the overvoltage, whereas the sudden drop in the DC link voltage causes a low voltage. Thus, the water pump 6 cannot operate under the over-voltage or low voltage conditions. Further, frequent change of the pump 6 between operation/stop states causes the pump 6 to fail as in the frequent frequency change, thereby increasing the energy loss.

Conventionally, the DC link voltage is used as the information for generating the inverter PMW output waveform for controlling the water pump 6 and as information for detecting the low voltage/high voltage. However, in one embodiment of the present disclosure, the increase and decrease of the DC link voltage is continuously checked, and, then, the output frequency changes based on the increase and decrease of the DC link voltage to prevent the abrupt change of the DC link voltage according to the solar irradiation quantity.

According to the present disclosure, the changes in the DC link voltage may be sensed without additional sensors, thereby to allow the power generated by the solar module to be used at a maximum level.

It will be apparent to those skilled in the art that various modifications and variations may be made in the present invention without departing from the spirit of the present disclosure. The technical scope of the present disclosure is not limited to the contents described in the embodiments but should be determined by the claims and equivalents thereof

What is claimed is:

1. A method for controlling an inverter, wherein the invertor converts power received from a solar module and supplies the converted power to a load, the method comprising:
receiving a current direct-current link voltage of the inverter;
when the current DC link voltage is above or equal to a reference level, and when a previous output frequency of an alternating-current voltage applied to the load increased in a previous period, increasing an current output frequency of an AC voltage to be applied to the load at a first slope; and
when the current DC link voltage is above or equal to the reference level, and when the previous output frequency of the AC voltage applied to the load decreased in the previous period, increasing the current output frequency of the AC voltage to be applied to the load at a second slope smaller than the first slope.

2. The method of claim 1, wherein the method further comprises:
- when the current DC link voltage is below the reference level, and when a previous DC link voltage in the previous period is below the reference level, decreasing the current output frequency of the AC voltage to be applied to the load.

3. The method of claim 1, wherein the method further comprises:
- when the current DC link voltage is below the reference level, and when a previous DC link voltage in the previous period is above or equal to the reference level, storing the current output frequency in a current period as a first output frequency, and decreasing the current output frequency of the AC voltage to be applied to the load.

4. The method of claim 3, wherein the method further comprises:
- when a further output frequency increased at the second slope is greater than or equal to the first output frequency, fixing the further output frequency.

5. The method of claim 4, wherein the method further comprises:
- when the current DC link voltage is stable for a predetermined time after fixing the further output frequency, clearing the current decreased output frequency state and clearing the first output frequency.

6. The method of claim 5, wherein whether the current DC link voltage is stable is based on whether the current DC link voltage varies in a threshold range.

\* \* \* \* \*